United States Patent
Li et al.

(10) Patent No.: US 11,108,247 B2
(45) Date of Patent: Aug. 31, 2021

(54) METHOD, APPARATUS, DEVICE AND MEDIUM FOR EQUALIZATION CONTROL OF BATTERY PACKS

(71) Applicant: Contemporary Amperex Technology Co., Limited, Ningde (CN)

(72) Inventors: Shichao Li, Ningde (CN); Mingshu Du, Ningde (CN); Shenzhi Tang, Ningde (CN); Jian Ruan, Ningde (CN); Yanhua Lu, Ningde (CN); Wei Zhang, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 0 days.

(21) Appl. No.: 17/106,239

(22) Filed: Nov. 30, 2020

(65) Prior Publication Data

US 2021/0083484 A1    Mar. 18, 2021

Related U.S. Application Data

(63) Continuation of application No. PCT/CN2020/085656, filed on Apr. 20, 2020.

(30) Foreign Application Priority Data

Apr. 24, 2019  (CN) .......................... 201910335092.1

(51) Int. Cl.
*H02J 7/00* (2006.01)

(52) U.S. Cl.
CPC .......... *H02J 7/0014* (2013.01); *H02J 7/0048* (2020.01)

(58) Field of Classification Search
CPC ....... H02J 7/0014; H02J 7/0048; H02J 7/0031
(Continued)

(56) References Cited

U.S. PATENT DOCUMENTS

2008/0077339 A1   3/2008   Seo et al.
2009/0248331 A1   10/2009  Barsukov
(Continued)

FOREIGN PATENT DOCUMENTS

CN   204424402 U   6/2015
CN   106026260 A   10/2016
(Continued)

OTHER PUBLICATIONS

PCT International Search Report for PCT/CN2020/085656, dated Jul. 21, 2020, 18 pages.
(Continued)

*Primary Examiner* — Nathaniel R Pelton
*Assistant Examiner* — Mohammed J Sharief
(74) *Attorney, Agent, or Firm* — Law Offices of Liaoteng Wang

(57) ABSTRACT

The present application discloses a method, apparatus, device and medium for equalization control of battery packs. The method may include: acquiring a voltage of each of a plurality of cells of the battery pack; on the condition that one or more voltages of the voltages of the plurality of cells are within a preset voltage interval, selecting a target State of Charge (SOC)-Open Circuit Voltage (OCV) curve from a charging SOC-OCV curve and a discharging SOC-OCV curve stored for the battery pack based on the voltages within the preset voltage interval; acquiring a target SOC of each cell based on the target SOC-OCV curve and the voltage of each cell; calculating, for each cell, a SOC difference between the target SOC of the cell and a reference SOC; calculating an equalizing time for each cell based on the SOC difference of each cell.

11 Claims, 3 Drawing Sheets

(58) Field of Classification Search
USPC .................................................. 320/134, 136
See application file for complete search history.

(56) References Cited

U.S. PATENT DOCUMENTS

| | | | | |
|---|---|---|---|---|
| 2014/0111160 | A1* | 4/2014 | Nozawa | H02J 7/0026 320/118 |
| 2015/0191100 | A1* | 7/2015 | Schindler | B60L 11/1866 307/10.1 |
| 2015/0253389 | A1* | 9/2015 | Arai | G01R 31/3828 324/427 |
| 2016/0056655 | A1* | 2/2016 | Kaneda | H02J 7/0021 320/136 |
| 2016/0276847 | A1* | 9/2016 | Kang | H01M 10/441 |
| 2018/0313906 | A1 | 11/2018 | Takahashi et al. | |
| 2020/0341072 | A1* | 10/2020 | Nakamoto | H02J 7/0048 |

FOREIGN PATENT DOCUMENTS

| | | |
|---|---|---|
| CN | 104659434 B | 4/2017 |
| CN | 107091993 A | 8/2017 |
| CN | 107102263 A | 8/2017 |
| CN | 108063293 A | 5/2018 |
| CN | 108206560 A | 6/2018 |
| CN | 108761343 A | 11/2018 |
| CN | 108767911 A | 11/2018 |
| CN | 109428355 A | 3/2019 |
| CN | 109435775 A | 3/2019 |
| CN | 110970964 A | 4/2020 |
| JP | 2018125977 A | 8/2018 |

OTHER PUBLICATIONS

The First Office Action and search report dated Aug. 4, 2020 for Chinese Application No. 201910335092.1, 6 pages.
The Extended European Search Report for European Application No. 20794365.5, dated Jun. 8, 2021, 8 pages.

* cited by examiner

METHOD, APPARATUS, DEVICE AND MEDIUM FOR EQUALIZATION CONTROL OF BATTERY PACKS

CROSS-REFERENCE TO RELATED APPLICATIONS

The present application is a continuation of International Application No. PCT/CN2020/085656, filed on Apr. 20, 2020, which claims priority to Chinese patent application No. 201910335092.1, entitled "METHOD, APPARATUS, DEVICE AND MEDIUM FOR EQUALIZATION CONTROL OF BATTERY PACKS", filed on Apr. 24, 2019, both of which are incorporated herein by reference.

TECHNICAL FIELD

The present application relates to the field of new energy, and in particular, to a method, apparatus, device and medium for equalization control of battery packs.

BACKGROUND

Since cells in a battery pack are inconsistent with each other in parameters such as a self-discharging rate, an initial State of Charge (State of Charge, SOC), a capacity, a capacity of the battery pack is not only limited by the cell with the minimum capacity, but also would not fully function due to such inconsistency. To increase the available capacity of the battery pack, the battery pack may be equalized.

Currently, equalizing information of cells in the battery pack, such as whether the cells need to be equalized and how long the cells need to be equalized, are determined as follows: a SOC difference of each cell is determined first according to an Open Circuit Voltage (Open Circuit Voltage, OCV) of the cell and a SOC-OCV curve of the battery pack, and then the equalizing information of the cell are determined according to the SOC difference of the cell.

However, due to a hysteresis effect of some of the cells, which refers to an inconsistency between a charging OCV and a discharging OCV of a cell, the SOC difference may not be estimated accurately, and thus the equalizing information of the cells may not be obtained precisely.

SUMMARY

The embodiments of the present application may provide a method, apparatus, device and medium for equalization control of battery packs.

According to one aspect of the embodiments of the present application, a method for equalization control of a battery pack may be provided, which may include:
acquiring a voltage of each of a plurality of cells of the battery pack;
on the condition that one or more of the voltages of the plurality of cells are within a preset voltage interval, selecting a target State of Charge (SOC)-Open Circuit Voltage (OCV) curve from a charging SOC-OCV curve and a discharging SOC-OCV curve stored for the battery pack based on the voltages within the preset voltage interval;
acquiring a target SOC of each cell based on the target SOC-OCV curve and the voltage of each cell;
calculating, for each cell, a SOC difference between the target SOC of the cell and a reference SOC;
calculating an equalizing time for each cell based on the SOC difference of each cell;
the preset voltage interval may be determined based on a hysteresis interval, and the hysteresis interval is an OCV interval corresponding to a section in which the charging SOC-OCV curve is not overlapping with the discharging SOC-OCV curve.

In one embodiment, the preset voltage interval may include a first voltage subinterval and a second voltage subinterval,
voltage values within the first voltage subinterval are greater than or equal to an upper limit value of the hysteresis interval, and voltage values within the second voltage subinterval are less than or equal to a lower limit value of the hysteresis interval.

In one embodiment, selecting the target State of Charge (SOC)-Open Circuit Voltage (OCV) curve from the charging SOC-OCV curve and the discharging SOC-OCV curve stored for the battery pack based on the voltages within the preset voltage interval may include:
on the condition that at least one of the voltages within the preset voltage interval is within the first voltage subinterval, selecting the charging SOC-OCV curve as the target SOC-OCV curve;
on the condition that all of the voltages within the preset voltage interval are within the second voltage subinterval, selecting the discharging SOC-OCV curve as the target SOC-OCV curve.

In one embodiment, on the condition that at least one of the voltages within the preset voltage interval is within the first voltage subinterval, selecting the charging SOC-OCV curve as the target SOC-OCV curve may include:
on the condition that a first voltage of the voltages of the plurality of cells is greater than or equal to the upper limit value, determining that at least one of the voltages within the preset voltage interval is within the first voltage subinterval, and selecting the charging SOC-OCV curve as the target SOC-OCV curve;
the first voltage is greater than or equal to remaining voltages of the voltages of the plurality of cells.

In one embodiment, on the condition that all of the voltages within the preset voltage interval are within the second voltage subinterval, selecting the discharging SOC-OCV curve as the target SOC-OCV curve may include:
on the condition that the voltage of each cell is less than the upper limit value and a second voltage of the voltages of the plurality of cells is less than or equal to the lower limit value, determining that all of the voltages within the preset voltage interval are within the second voltage subinterval, and selecting the discharging SOC-OCV curve as the target SOC-OCV curve;
the second voltage is less than or equal to remaining voltages of the voltages of the plurality of cells.

In one embodiment, on the condition that the target SOC-OCV curve is the charging SOC-OCV curve, the target SOC is a charging SOC, the reference SOC is a first charging SOC, and the first charging SOC is less than or equal to remaining charging SOCs of charging SOCs of the plurality of cells;
calculating, for each cell, the SOC difference between the target SOC of the cell and the reference SOC may include:
calculating, for each cell, a difference value by subtracting the first charging SOC from the charging SOC of the cell as the SOC difference of the cell.

In one embodiment, on the condition that the target SOC-OCV curve is the discharging SOC-OCV curve, the target SOC is a discharging SOC, the reference SOC is a first discharging SOC, and the first discharging SOC is less than or equal to remaining discharging SOCs of discharging SOCs of the plurality of cells;

calculating, for each cell, the SOC difference between the target SOC of the cell and the reference SOC may include:

calculating, for each cell, a difference value by subtracting the first discharging SOC from the discharging SOC of the cell as the SOC difference of the cell.

In one embodiment, calculating the equalizing time for each cell based on the SOC difference of each cell may include:

calculating a capacity difference for each cell based on the SOC difference of each cell and a nominal capacity;

obtaining the equalizing time for each cell according to the capacity difference of each cell and an acquired equalizing current.

According to another aspect of the embodiments of the present application, an apparatus for equalization control of a battery pack may be provided, which may include:

a voltage acquiring module, configured to acquire a voltage of each of a plurality of cells of the battery pack;

a target curve selecting module, configured to on the condition that one or more of the voltages of the plurality of cells are within a preset voltage interval, select a target State of Charge (SOC)-Open Circuit Voltage (OCV) curve from a charging SOC-OCV curve and a discharging SOC-OCV curve stored for the battery pack based on the voltages within the preset voltage interval;

a SOC acquiring module, configured to acquire a target SOC of each cell based on the target SOC-OCV curve and the voltage of each cell;

a SOC difference calculating module, configured to calculate, for each cell, a SOC difference between the target SOC of the cell and a reference SOC;

an equalizing time calculating module, configured to calculate an equalizing time for each cell based on the SOC difference of each cell;

the preset voltage interval may be determined based on a hysteresis interval, and the hysteresis interval is an OCV interval corresponding to a section in which the charging SOC-OCV curve is not overlapping with the discharging SOC-OCV curve.

According to yet another aspect of the embodiments of the present application, a device for equalization control of a battery pack may be provided, which may include: a processor and a memory storing computer program instructions;

the processor may implement the method for equalization control of the battery pack as provided by the embodiments of the present application when executing the computer program instructions.

According to yet another aspect of the embodiments of the present application, a non-transitory computer storage medium may be provided, in which the computer storage medium may store computer program instructions thereon which may implement, when executed by a processor, the method for equalization control of the battery pack as provided by the embodiments of the present application.

BRIEF DESCRIPTION OF THE DRAWINGS

Features, advantages, and technical effects of the exemplary embodiments of the present application will be described below with reference to the drawings.

DETAILED DESCRIPTION

Implementation of the present application are described in further detail below with reference to the drawings and embodiments. The detailed description and drawings of the following embodiments are used to exemplarily illustrate the principle of the present application, but should not be used to limit the scope of the present application, that is, the present application is not limited to the described embodiments.

It should be noted that, in the present application, relational terms, such as first and second, are used merely to distinguish one entity or operation from another entity or operation, without necessarily requiring or implying any actual such relationships or orders of these entities or operations. Moreover, the terms "comprise", "include", or any other variants thereof, are intended to represent a non-exclusive inclusion, such that a process, method, article or device including a series of elements includes not only those elements, but also other elements that are not explicitly listed or elements inherent to such a process, method, article or device. Without more constraints, the elements following an expression "comprise/include . . . " do not exclude the existence of additional identical elements in the process, method, article or device that includes the elements.

For a better understanding of the present application, a method, apparatus, device and medium for equalization control of battery packs according to the embodiments of the present application will be described in detail below with reference to the drawings. It should be noted that these embodiments are not intended to limit the scope of the present application.

Figure 1:
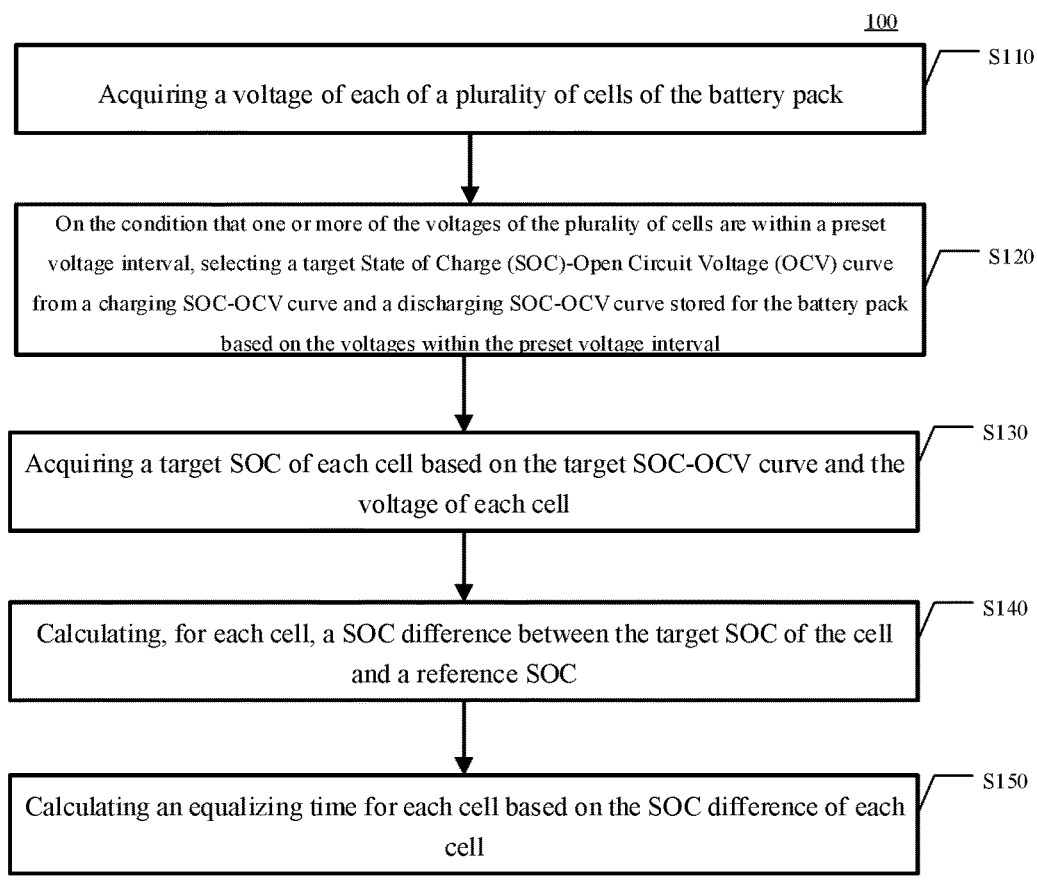
FIG. 1 is a schematic flowchart of a method for equalization control of a battery pack provided in some embodiments of the present application.

FIG. 1 shows a schematic flowchart of a method for equalization control of a battery pack according to the embodiments of the present application. As shown in FIG. 1, the method for equalization control of the battery pack provided in the embodiments of the present application may include the following steps:

S110, acquiring a voltage of each of a plurality of cells of the battery pack.

S120, on the condition that one or more of the voltages of the plurality of cells are within a preset voltage interval, selecting a target State of Charge (SOC)-Open Circuit Voltage (OCV) curve from a charging SOC-OCV curve and a discharging SOC-OCV curve stored for the battery pack based on the voltages within the preset voltage interval.

S130, acquiring a target SOC of each cell based on the target SOC-OCV curve and the voltage of each cell.

S140, calculating, for each cell, a SOC difference between the target SOC of the cell and a reference SOC.

S150, calculating an equalizing time for each cell based on the SOC difference of each cell.

In the embodiments of the present application, the charging SOC-OCV curve is a charging SOC-OCV curve of the battery pack during a charging process. The discharging SOC-OCV curve is a discharging SOC-OCV curve of the battery pack during a discharging process.

It should be noted that the voltage of each cell in the battery pack involved in the embodiments of the present application is an open circuit voltage of each cell. Herein, the open circuit voltage of the cell refers to a voltage of the cell in an open circuit state, that is, a voltage difference between the two terminals of the cell when no current flows through the cell.

In the embodiments of the present application, the preset voltage interval may be determined based on a hysteresis interval. The hysteresis interval is an OCV interval corresponding to a section in which the charging SOC-OCV curve is not overlapping with the discharging SOC-OCV curve.

Figure 2:
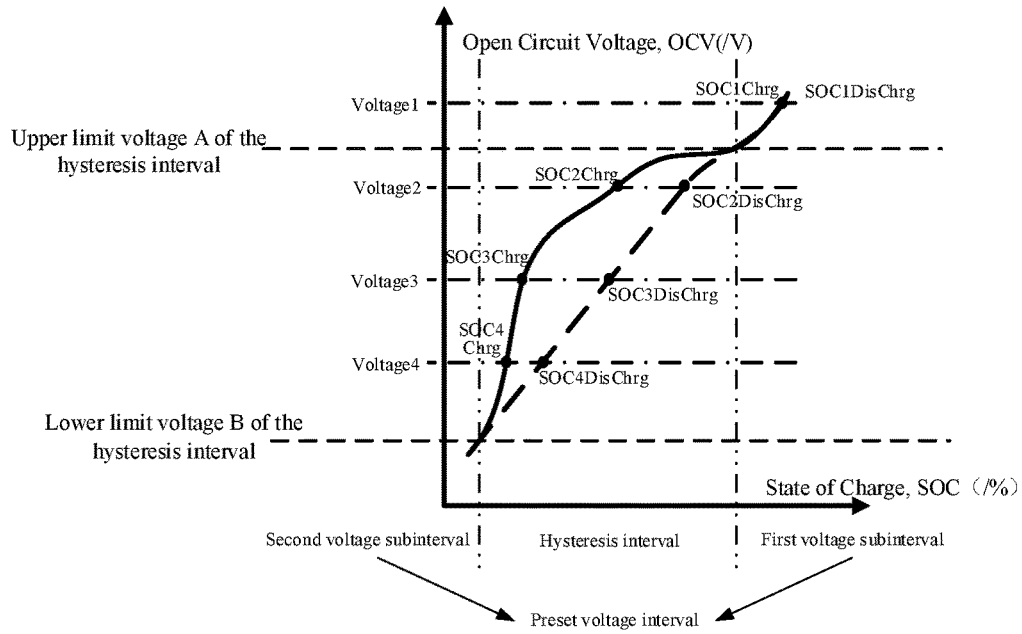
FIG. 2 is a diagram of a charging SOC-OCV curve and a discharging SOC-OCV curve provided in some embodiments of the present application.

The hysteresis interval is described below with reference to specific examples. In the embodiments of the present application, the OCV interval of the cell may be divided into a hysteresis OCV interval and a non-hysteresis OCV interval. FIG. 2 shows a charging SOC-OCV curve and a discharging SOC-OCV curve of a cell. Herein, the horizontal axis is the SOC of the cell, and the vertical axis is the open circuit voltage of the cell. The solid line is the charging SOC-OCV curve of the cell, and the dashed line is the discharging SOC-OCV curve of the cell.

As shown in FIG. 2, the hysteresis interval may have an upper limit value and a lower limit value. The upper limit value of the hysteresis interval is the upper limit voltage A in FIG. 2, and the lower limit value of the hysteresis interval is the lower limit voltage B in FIG. 2. The non-hysteresis interval is an OCV interval corresponding to a section in which the charging SOC-OCV curve is overlapping with the discharging SOC-OCV curve.

In the embodiments of the present application, the preset voltage interval may include a first voltage subinterval and a second voltage subinterval. Herein, the voltage values within the first voltage subinterval are greater than or equal to the upper limit value of the hysteresis interval. That is, the first voltage subinterval may be [A, A'], and A' is an upper limit value of a usage interval of the voltage of the cell. The voltage values within the second voltage subinterval are less than or equal to the lower limit value of the hysteresis interval. That is, the second voltage subinterval may be [B', B], and B' is a lower limit value of the usage interval of the voltage of the cell. Herein, both the A' and B' may be preset voltage values.

In other words, the preset voltage interval may include the non-hysteresis interval, the upper limit voltage A of the hysteresis interval, and the lower limit voltage B of the hysteresis interval.

In the embodiments of the present application, the target SOC-OCV curve for the equalization of the battery pack may be determined from the charging SOC-OCV curve and the discharging SOC-OCV curve based on the voltages within the preset voltage interval, so that the equalizing time for the cells with the hysteresis effect may be calculated accurately according to the target SOC-OCV curve.

In the embodiments of the present application, in step S120, on the condition that at least one of the voltages within the preset voltage interval is within the first voltage subinterval, selecting the charging SOC-OCV curve as the target SOC-OCV curve. That is, as long as one or more voltages of all the cells are greater than or equal to the upper limit value of the hysteresis interval, the equalizing information for each cell in the battery pack may be calculated according to the charging SOC-OCV curve.

In some specific examples, on the condition that a first voltage of the voltages of the plurality of cells is greater than or equal to the upper limit value, it may be determined that at least one of the voltages within the preset voltage interval is within the first voltage subinterval. Herein, the first voltage may be greater than or equal to remaining voltages of the voltages of the plurality of cells. That is, the first voltage may be the highest voltage of the voltages of all of the cells.

In step S120, on the condition that all of the voltages within the preset voltage interval are within the second voltage subinterval, selecting the discharging SOC-OCV curve as the target SOC-OCV curve. That is, if no voltage of all the cells is greater than or equal to the upper limit value of the hysteresis interval, but one or more of the voltages of all of the cells are less than or equal to the lower limit value of the hysteresis interval, the equalizing information for each cell in the battery pack may be calculated according to the discharging SOC-OCV curve.

In some specific examples, on the condition that the voltage of each cell is less than the upper limit value and a second voltage of the voltages of the plurality of cells is less than or equal to the lower limit value, it may be determined that all of the voltages within the preset voltage interval are within the second voltage subinterval. The second voltage may be less than or equal to remaining voltages of the voltages of the plurality of cells. That is, the second voltage may be the lowest voltage of the voltages of all of the cells.

In the embodiments of the present application, if the voltage of each cell is less than the upper limit value of the hysteresis interval and greater than the lower limit value of the hysteresis interval, the battery pack may not be equalized.

In some embodiments of the present application, on the condition that the target SOC-OCV curve is the charging SOC-OCV curve, the target SOC is a charging SOC, the reference SOC is a first charging SOC, and the first charging SOC is less than or equal to remaining charging SOCs of charging SOCs of the plurality of cells. That is, the reference SOC may be the lowest charging SOC of the charging SOCs of the plurality of cells. As a specific example, the first charging SOC may be the lowest charging SOC of the charging SOCs of all of the cells. Then in step S140, calculating, for each cell, a difference value by subtracting the first charging SOC from the charging SOC of the cell as the SOC difference of the cell.

In some embodiments of the present application, on the condition that the target SOC-OCV curve is the discharging SOC-OCV curve, the target SOC is a discharging SOC, the reference SOC is a first discharging SOC, and the first discharging SOC is less than or equal to remaining discharging SOCs of discharging SOCs of the plurality of cells. That is, the first discharging SOC may be the lowest discharging SOC of the discharging SOCs of the plurality of cells. As a specific example, the first discharging SOC may be the lowest discharging SOC of the discharging SOCs of all of the cells. Then in step S140, calculating, for each cell, a difference value by subtracting the discharging SOC corresponding to the second voltage of the voltages of the plurality of cells from the discharging SOC of the cell as the SOC difference of the cell.

The following will introduce how to determine the equalizing information of each cell in the battery pack based on the target SOC-OCV curve with reference to specific examples.

Figure 3:
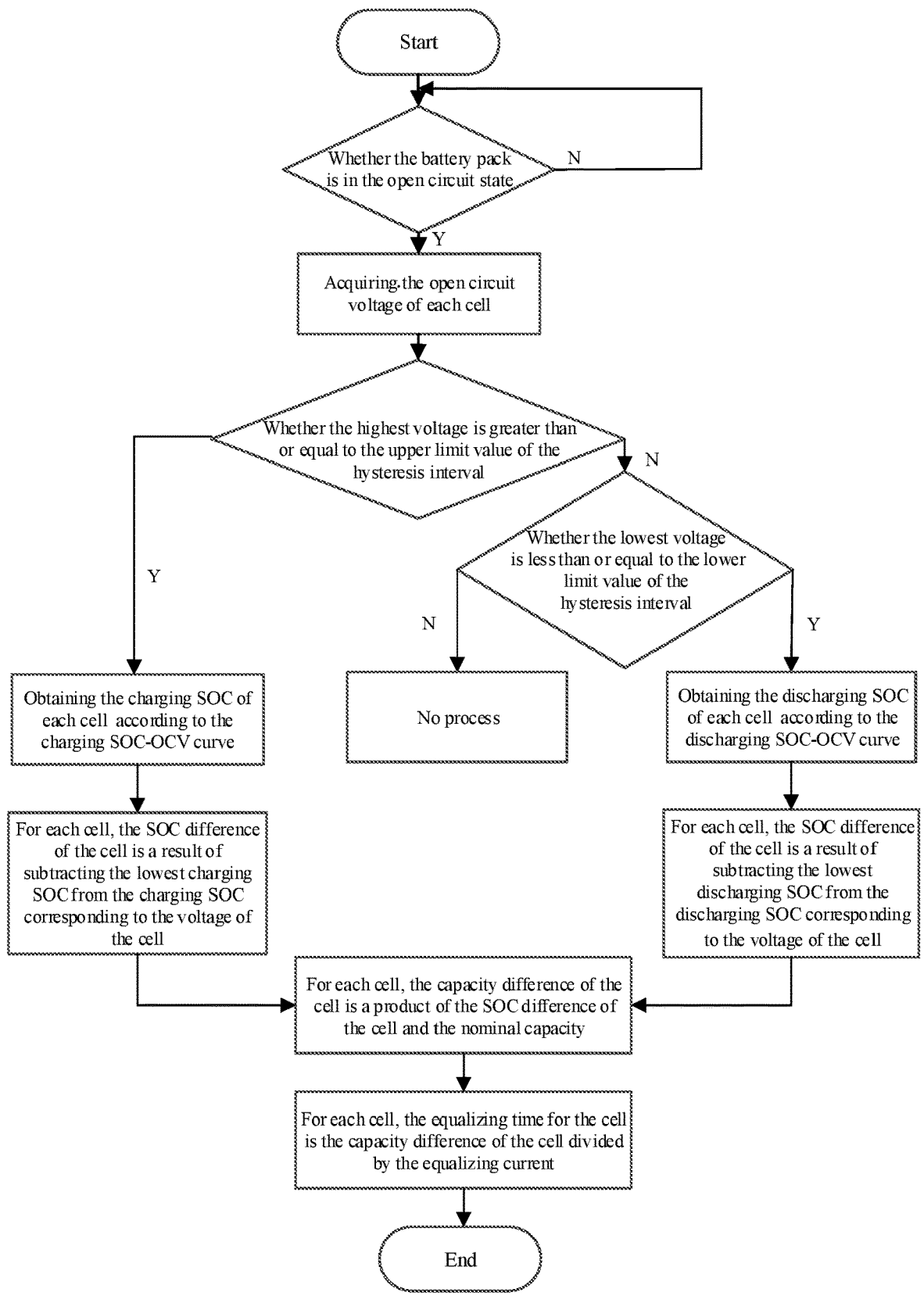
FIG. 3 is a schematic flowchart of a method for equalization control of a battery pack provided in some other embodiments of the present application.

FIG. 3 shows a schematic flowchart of a method for equalization control of a battery pack provided in the exemplary embodiments of the present application. As shown in FIG. 3, whether the battery pack is in the open circuit state may be first decided. As an example, whether the battery pack is in the open circuit state may be decided by deciding whether there is a current flowing through the battery pack. For example, if the current in the battery pack is zero, it may be determined that the battery pack is in the open circuit state. If the battery pack is not in the open circuit state, whether the battery pack is in the open circuit state may be decided again every preset time period T1.

If it is determined that the battery pack is in the open circuit state, the open circuit voltage of each cell may be acquired after a preset time period T2. The open circuit voltage of each cell may be acquired again after the preset time period T2, so as to acquire a stable open circuit voltage for each cell.

In some examples, the open circuit voltage of each cell may be acquired from a cell management unit. The cell management unit may be used to collect the open circuit voltage of each cell.

After the open circuit voltage of each cell is acquired, the highest voltage of the voltages of all of the cells may be first determined, and then whether the highest voltage is greater than or equal to the upper limit voltage of the hysteresis interval may be decided.

(I) If the highest voltage is greater than or equal to the upper limit voltage of the hysteresis interval, it may mean that at least one of the voltages of all of the cells is within the first voltage subinterval, and the charging SOC-OCV curve may be determined as the target SOC-OCV curve.

After the charging SOC-OCV curve is determined as the target SOC-OCV curve, the charging SOC corresponding to the open circuit voltage of each cell may be first obtained based on the charging SOC-OCV curve of the battery pack and the open circuit voltage of each cell. As an example, referring to FIG. 2, the SOC1Chrg, SOC2Chrg, SOC3Chrg, SOC4Chrg are the charging SOCs corresponding to the open circuit voltage Voltage1, the open circuit voltage Voltage2, the open circuit voltage Voltage3, and the open circuit voltage Voltage4, respectively.

Calculating, for each cell, a difference value by subtracting the lowest charging SOC from the charging SOC of the cell as the SOC difference of the cell.

(II) If the highest voltage is less than the upper limit value of the hysteresis interval, whether the lowest voltage of the voltages of all of the cells is less than or equal to the lower limit value of the hysteresis interval may be decided.

If the lowest voltage is greater than the lower limit value of the hysteresis interval, it may mean that the voltages of all of the cells are within the hysteresis interval, and the cells in the battery pack may not be equalized, that is, no process is performed.

If the lowest voltage is less than or equal to the lower limit value of the hysteresis interval, the discharging SOC-OCV curve may be determined as the target SOC-OCV curve.

After the discharging SOC-OCV curve is determined as the target SOC-OCV curve, the discharging SOC corresponding to the voltage of each cell may be first obtained based on the discharging SOC-OCV curve and the voltage of each cell. As an example, referring to FIG. 2, the SOC1DisChrg, SOC2DisChrg, SOC3DisChrg, SOC4DisChrg are the discharging SOCs corresponding to the open circuit voltage Voltage1, the open circuit voltage Voltage2, the open circuit voltage Voltage3, and the open circuit voltage Voltage4, respectively.

Referring to FIG. 2, since the open circuit voltage Voltage1 is outside the hysteresis interval, the discharging SOC corresponding to the open circuit voltage Voltage1 is equal to the charging SOC corresponding to the open circuit voltage Voltage1. That is, the SOC1DisChrg and the SOC1Chrg are equal. However, the open circuit voltage Voltage2, open circuit voltage Voltage3, and open circuit voltage Voltage4 are within the hysteresis interval, thus for each of the open circuit voltage Voltage2, open circuit voltage Voltage3, and open circuit voltage Voltage4, the corresponding charging SOC and discharging SOC are not equal.

Calculating, for each cell, a difference value by subtracting the lowest discharging SOC from the discharging SOC of the cell as the SOC difference of the cell.

In the embodiments of the present application, after the SOC difference of each cell is calculated according to the target SOC-OCV curve and the voltage of each cell, the equalizing time for each cell may be calculated based on the SOC difference of each cell.

In some examples, a capacity difference for each cell may be calculated based on the SOC difference of each cell and a nominal capacity. Specifically, the capacity difference of each cell may be a product of the SOC difference of the cell and the nominal capacity.

Next, the equalizing time for each cell may be obtained according to the capacity difference of each cell and an acquired equalizing current. Herein, the equalizing current may be a preset current or may be calculated by other well-known methods, and will not be detailed herein. As an example, the equalizing time for each cell may be the capacity difference of the cell divided by the equalizing current.

After the equalizing time of each cell is calculated, each cell may be equalized according to the equalizing time of each cell.

In the embodiments of the present application, according to preset requirements, the equalizing time of the cell may be calculated multiple times according to the method of S110-S150. For example, the equalizing time of the cell may be calculated every fixed time period according to the method of S110-S150.

It should be noted that, in one calculation of the equalizing time, the reference SOC may be the lowest charging SOC or the lowest discharging SOC.

In some examples, the reference SOC used in each calculation of the equalizing time of the cell may be different. The specific value of the reference SOC may be determined by the voltage of each cell acquired each time, the charging SOC-OCV curve, and the discharging SOC-OCV curve.

The method for equalization control of the battery pack provided by the embodiments of the present application may determine the target SOC-OCV curve for equalizing based on the hysteresis interval and the voltages outside the preset voltage interval. The SOC difference of each cell may be obtained precisely according to the target SOC-OCV curve and the open circuit voltage of each cell, and in turn the equalizing time of the cells with the hysteresis effect may be obtained precisely.

Figure 4:
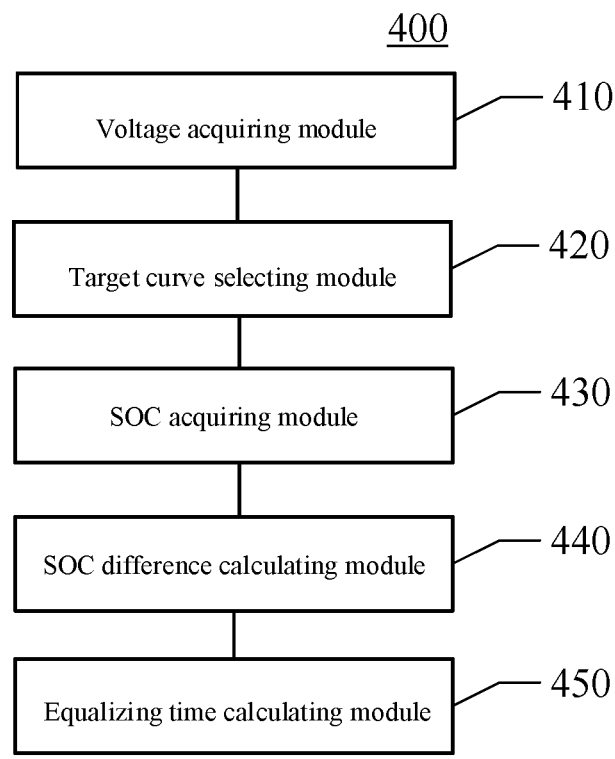
FIG. 4 is a structural diagram of an apparatus for equalization control of a battery pack provided in the embodiments of the present application.

FIG. 4 shows a structural diagram of an apparatus for equalization control of a battery pack provided according to the embodiments of the present application. As shown in FIG. 4, the apparatus 400 for equalization control of the battery pack may include:

a voltage acquiring module 410, configured to acquire a voltage of each of a plurality of cells of the battery pack;

a target curve selecting module 420, configured to on the condition that one or more of the voltages of the plurality of cells are within a preset voltage interval, select a target State of Charge (SOC)-Open Circuit Voltage (OCV) curve from a charging SOC-OCV curve and a discharging SOC-OCV curve stored for the battery pack based on the voltages within the preset voltage interval;

a SOC acquiring module 430, configured to acquire a target SOC of each cell based on the target SOC-OCV curve and the voltage of each cell;

a SOC difference calculating module 440, configured to calculate, for each cell, a SOC difference between the target SOC of the cell and a reference SOC;

an equalizing time calculating module 450, configured to calculate an equalizing time for each cell based on the SOC difference of each cell;

the preset voltage interval may be determined based on a hysteresis interval, and the hysteresis interval is an OCV interval corresponding to a section in which the charging SOC-OCV curve is not overlapping with the discharging SOC-OCV curve.

In the embodiments of the present application, the preset voltage interval may include a first voltage subinterval and a second voltage subinterval, voltage values within the first voltage subinterval are greater than or equal to an upper limit value of the hysteresis interval, and voltage values within the second voltage subinterval are less than or equal to a lower limit value of the hysteresis interval.

In the embodiments of the present application, the target curve selecting module 420 may be specifically configured to:

on the condition that at least one of the voltages within the preset voltage interval is within the first voltage subinterval, select the charging SOC-OCV curve as the target SOC-OCV curve;

on the condition that all of the voltages within the preset voltage interval are within the second voltage subinterval, select the discharging SOC-OCV curve as the target SOC-OCV curve.

In the embodiments of the present application, the target curve selecting module 420 may be further specifically configured to:

on the condition that a first voltage of the voltages of the plurality of cells is greater than or equal to the upper limit value, determine that at least one of the voltages within the preset voltage interval is within the first voltage subinterval, and select the charging SOC-OCV curve as the target SOC-OCV curve;

the first voltage is greater than or equal to remaining voltages of the voltages of the plurality of cells.

In the embodiments of the present application, the target curve selecting module 420 may be further specifically configured to:

on the condition that the voltage of each cell is less than the upper limit value and a second voltage of the voltages of the plurality of cells is less than or equal to the lower limit value, determine that all of the voltages within the preset voltage interval are within the second voltage subinterval, and select the discharging SOC-OCV curve as the target SOC-OCV curve;

the second voltage is less than or equal to remaining voltages of the voltages of the plurality of cells.

In the embodiments of the present application, on the condition that the target SOC-OCV curve is the charging SOC-OCV curve, the target SOC is a charging SOC, the reference SOC is a first charging SOC, and the first charging SOC is less than or equal to remaining charging SOCs of charging SOCs of the plurality of cells, then the SOC difference calculating module 440 may be specifically configured to:

calculate, for each cell, a difference value by subtracting the first charging SOC from the charging SOC of the cell as the SOC difference of the cell.

In the embodiments of the present application, on the condition that the target SOC-OCV curve is the discharging SOC-OCV curve, the target SOC is a discharging SOC, the reference SOC is a first discharging SOC, and the first discharging SOC is less than or equal to remaining discharging SOCs of discharging SOCs of the plurality of cells, then the SOC difference calculating module 440 may be specifically configured to:

calculate, for each cell, a difference value by subtracting the first discharging SOC from the discharging SOC of the cell as the SOC difference of the cell.

In the embodiments of the present application, the equalizing time calculating module 450 may be specifically configured to:

calculate a capacity difference for each cell based on the SOC difference of each cell and a nominal capacity;

obtain the equalizing time for each cell according to the capacity difference of each cell and an acquired equalizing current.

The apparatus for equalization control of the battery pack provided by the embodiments of the present application may select the target SOC-OCV curve for equalizing based on the hysteresis interval and the voltages outside the preset voltage interval. The SOC difference of each cell may be obtained precisely according to the target SOC-OCV curve and the open circuit voltage of each cell, and in turn the equalizing time for the cells with the hysteresis effect may be obtained precisely.

Other details of the apparatus for equalization control of the battery pack according to the embodiments of the present application are similar to those of the method according to the embodiments of the present application described above with reference to FIG. 1 to FIG. 3, and will not be detailed herein.

Figure 5:
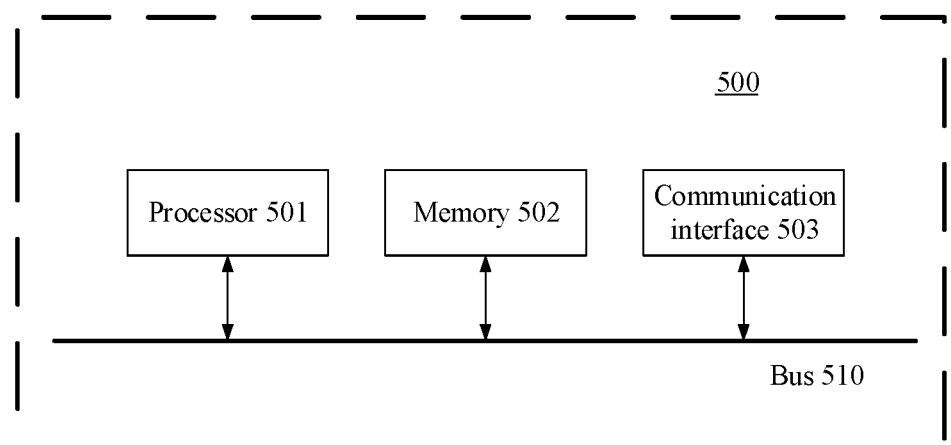
FIG. 5 is a structural diagram of a device for equalization control of a battery pack according to the embodiments of the present application.

The method and apparatus for equalization control of the battery pack according to the embodiments of the present application described with reference to FIG. 1 to FIG. 4 may be implemented by a device for equalization control of a battery pack. FIG. 5 is a diagram showing a hardware structure 500 of the device for equalization control of the battery pack according to the embodiments of the present application.

As shown in FIG. 5, the device 500 for equalization control of the battery pack in the embodiment may include: a processor 501, a memory 502, a communication interface 503, and a bus 510, in which the processor 501, the memory 502, and the communication interface 503 may be connected through the bus 510 and communicate with each other.

Specifically, the above processor 501 may include a central processing unit (CPU), or a specific integrated circuit (ASIC), or may be configured to implement one or more integrated circuits according to the embodiments of the present application.

The memory 502 may include a mass storage for data or instructions. By way of examples rather than limitation, the memory 502 may include an HDD, a floppy disk drive, a flash memory, an optical disk, a magneto-optical disk, a magnetic tape or a universal serial bus (USB) drive, or a combination of two or more of them. Where appropriate, the memory 502 may include a removable or non-removable (or fixed) medium. Where appropriate, the memory 502 may be internal or external to the device 500 for equalization control of the battery pack. In a particular embodiment, the memory 502 may be a non-volatile solid state memory. In a particular embodiment, the memory 502 may include a read-only memory (ROM). Where appropriate, the ROM may be a mask-programmed ROM, a programmable ROM (PROM), an erasable PROM (EPROM), an electrically erasable PROM (EEPROM), an electrically rewritable ROM (EAROM) or a flash memory, or a combination of two or more of them.

The communication interface 503 may be mainly used to implement communications among various modules, apparatuses, units, and/or devices in the embodiments of the present application.

The bus 510 may include a hardware, a software, or both, and may couple the components of the device 500 for equalization control of the battery pack to each other. By way of examples rather than limitation, the bus may include an Accelerated Graphics Port (AGP) or other graphics buses, an Enhanced Industry Standard Architecture (EISA) bus, a Front Side Bus (FSB), a Hypertransport (HT) interconnect, an Industry Standard Architecture (ISA) Bus, an infinite bandwidth interconnect, a Low Pin Count (LPC) bus, a memory bus, a Microchannel Architecture (MCA) bus, a Peripheral Component Interconnect (PCI) bus, a PCI-Express (PCI-X) bus, a Serial Advanced Technology Attachment (SATA) bus, a Video Electronics Standards Association Local (VLB) bus, or other suitable buses, or a combination of two or more of them. Where appropriate, the bus 510 may include one or more buses. Although specific buses are described and illustrated in the embodiments of the present application, the present application may contemplate any suitable bus or interconnect.

That is, the device 500 for equalization control of the battery pack as shown in FIG. 5 may be implemented to include: the processor 501, the memory 502, the communication interface 503, and the bus 510. The processor 501, the memory 502, and the communication interface 503 may be connected through the bus 510 and communicate with each other. The memory 502 may be used to store program codes; the processor 501 may read executable program codes stored in the memory 502 to run programs corresponding to the executable program codes, to execute the method for equalization control of the battery pack according to any of the embodiments of the present application, thereby implementing the method and apparatus for equalization control of the battery pack described with reference to FIG. 1 to FIG. 3.

The embodiments of the present application may further provide a computer storage medium, and the computer storage medium may store computer program instructions thereon; the computer program instructions may implement, when executed by a processor, the method for equalization control of the battery pack provided in the embodiments of the present application.

It should be noted that the present application is not limited to the specific configurations and processes described above and shown in the figures. For simplicity, a detailed descriptions of well-known methods are omitted herein. In the above embodiments, several specific steps are described and shown as examples. However, the flow of the methods of the present application is not limited to the specific steps described and shown, those skilled in the art can make various changes, modifications and additions, or change the order of the steps, after understanding the gist of the present application.

Functional blocks shown in the above structural diagrams may be implemented as hardware, software, firmware, or a combination thereof. When implemented in hardware, the functional blocks may be, for example, an electronic circuit, an Application Specific Integrated Circuit (ASIC), a suitable firmware, a plug-in, a function card and the like. When implemented in software, elements of the present disclosure may be programs or code segments used to perform the required tasks. The programs or code segments may be stored in a machine-readable medium or transmitted over a transmission medium or a communication link via data signals carried in carriers. The "machine-readable medium" may include any medium capable of storing or transmitting information. Examples of the machine-readable medium may include an electronic circuit, a semiconductor memory device, a ROM, a flash memory, an erasable ROM (EROM), a floppy disk, a CD-ROM, an optical disk, a hard disk, a fiber medium, a Radio Frequency (RF) link, and the like. The code segments may be downloaded via a computer network, for example, the Internet, an intranet, and the like.

It should be further noted that exemplary embodiments mentioned in the present application describe some methods or systems based on a series of steps or apparatuses. However, the present application is not limited to the above described order of the steps, that is, the steps may be executed in the order mentioned in embodiments, or an order different from that in the embodiments, or several steps may be executed simultaneously The above are merely specific implementations of the present application, and those skilled in the art may explicitly appreciate that for convenience and conciseness of the descriptions, the specific working process of the above systems, modules and units may refer to corresponding processes in the forgoing method embodiments, and will not be repeated herein.

Although the present application has been described with reference to preferred embodiments, various modifications may be made thereto and components thereof may be replaced with their equivalents, without departing from the scope of the present application. In particular, as long as there is no structural conflict, various technical features mentioned in various embodiments can be combined in any manner. The present application is not limited to the specific embodiments disclosed herein, and instead, includes all the technical solutions that fall within the scope of the claims.

What is claimed is:

1. A method for equalization control of a battery pack, wherein the method comprises:
acquiring a voltage of each of a plurality of cells of the battery pack;
on the condition that one or more of the voltages of the plurality of cells are within a preset voltage interval, selecting a target State of Charge (SOC)-Open Circuit Voltage (OCV) curve from a charging SOC-OCV curve and a discharging SOC-OCV curve stored for the battery pack based on the one or more voltages within the preset voltage interval;
acquiring a target SOC of each cell based on the target SOC-OCV curve and the voltage of each cell;
calculating, for each cell, a SOC difference between the target SOC of the cell and a reference SOC;
calculating an equalizing time for each cell based on the SOC difference of each cell; and
controlling equalization of each cell according to the equalizing time calculated for each cell;
wherein the preset voltage interval is determined based on a hysteresis interval, and the hysteresis interval is an OCV interval corresponding to a section wherein the charging SOC-OCV curve is not overlapping with the discharging SOC-OCV curve.

2. The method according to claim 1, wherein the preset voltage interval comprises a first voltage subinterval and a second voltage subinterval, wherein
voltage values within the first voltage subinterval are greater than or equal to an upper limit value of the hysteresis interval, and voltage values within the second voltage subinterval are less than or equal to a lower limit value of the hysteresis interval.

3. The method according to claim 2, wherein selecting the target State of Charge (SOC)-Open Circuit Voltage (OCV) curve from the charging SOC-OCV curve and the discharging SOC-OCV curve stored for the battery pack based on the one or more voltages within the preset voltage interval comprises:
on the condition that at least one of the one or more voltages within the preset voltage interval is within the first voltage subinterval, selecting the charging SOC-OCV curve as the target SOC-OCV curve;
on the condition that all of the one or more voltages within the preset voltage interval are within the second voltage subinterval, selecting the discharging SOC-OCV curve as the target SOC-OCV curve.

4. The method according to claim 3, wherein on the condition that at least one of the one or more voltages within the preset voltage interval is within the first voltage subinterval, selecting the charging SOC-OCV curve as the target SOC-OCV curve comprises:
on the condition that a first voltage of the voltages of the plurality of cells is greater than or equal to the upper limit value, determining that at least one of the one or more voltages within the preset voltage interval is within the first voltage subinterval, and selecting the charging SOC-OCV curve as the target SOC-OCV curve;
wherein the first voltage is greater than or equal to remaining voltages of the voltages of the plurality of cells.

5. The method according to claim 3, wherein on the condition that all of the one or more voltages within the preset voltage interval are within the second voltage subinterval, selecting the discharging SOC-OCV curve as the target SOC-OCV curve comprises:
on the condition that the voltage of each cell is less than the upper limit value and a second voltage of the voltages of the plurality of cells is less than or equal to the lower limit value, determining that all of the one or more voltages within the preset voltage interval are within the second voltage subinterval, and selecting the discharging SOC-OCV curve as the target SOC-OCV curve;
wherein the second voltage is less than or equal to remaining voltages of the voltages of the plurality of cells.

6. The method according to claim 1, wherein on the condition that the target SOC-OCV curve is the charging SOC-OCV curve, the target SOC is a charging SOC, the reference SOC is a first charging SOC, and the first charging SOC is less than or equal to remaining charging SOCs of charging SOCs of the plurality of cells;
wherein calculating, for each cell, the SOC difference between the target SOC of the cell and the reference SOC comprises:
calculating, for each cell, a difference value by subtracting the first charging SOC from the charging SOC of the cell as the SOC difference of the cell.

7. The method according to claim 1, wherein on the condition that the target SOC-OCV curve is the discharging SOC-OCV curve, the target SOC is a discharging SOC, the reference SOC is a first discharging SOC, and the first discharging SOC is less than or equal to remaining discharging SOCs of discharging SOCs of the plurality of cells;
wherein calculating, for each cell, the SOC difference between the target SOC of the cell and the reference SOC comprises:
calculating, for each cell, a difference value by subtracting the first discharging SOC from the discharging SOC of the cell as the SOC difference of the cell.

8. The method according to claim 1, wherein calculating the equalizing time for each cell based on the SOC difference of each cell comprises:
calculating a capacity difference for each cell based on the SOC difference of each cell and a nominal capacity;
obtaining the equalizing time for each cell according to the capacity difference of each cell and an acquired equalizing current.

9. A device for equalization control of a battery pack, wherein the device comprises: a processor and a memory storing computer program instructions;
the processor implements the method for equalization control of the battery pack according to claim 1 when executing the computer program instructions.

10. A computer storage medium, wherein the computer storage medium stores computer program instructions thereon which implement, when executed by a processor, the method for equalization control of the battery pack according to claim 1.

11. An apparatus for equalization control of a battery pack, wherein the apparatus comprises:
a voltage acquiring module, configured to acquire a voltage of each of a plurality of cells of the battery pack;
a target curve selecting module, configured to on the condition that one or more of the voltages of the plurality of cells are within a preset voltage interval, select a target State of Charge (SOC)-Open Circuit Voltage (OCV) curve from a charging SOC-OCV curve and a discharging SOC-OCV curve stored for the battery pack based on the one or more voltages within the preset voltage interval;
a SOC acquiring module, configured to acquire a target SOC of each cell based on the target SOC-OCV curve and the voltage of each cell;
a SOC difference calculating module, configured to calculate, for each cell, a SOC difference between the target SOC of the cell and a reference SOC;
an equalizing time calculating module, configured to calculate an equalizing time for each cell based on the SOC difference of each cell; and
an equalization control module, configured to control equalization of each cell according to the equalizing time calculated for each cell;
wherein the preset voltage interval is determined based on a hysteresis interval, and the hysteresis interval is an OCV interval corresponding to a section wherein the charging SOC-OCV curve is not overlapping with the discharging SOC-OCV curve.

* * * * *